(12) United States Patent
Lin et al.

(10) Patent No.: US 11,756,989 B2
(45) Date of Patent: Sep. 12, 2023

(54) CAPACITOR INTEGRATED STRUCTURE

(71) Applicant: Powerchip Semiconductor Manufacturing Corporation, Hsinchu (TW)

(72) Inventors: Wei-Yu Lin, Hsinchu (TW); Chuan-Chieh Lin, Hsinchu (TW); Shih-Hao Cheng, Hsinchu (TW)

(73) Assignee: POWERCHIP SEMICONDUCTOR MANUFACTURING CORPORATION, Hsinchu (TW)

( * ) Notice: Subject to any disclaimer, the term of this patent is extended or adjusted under 35 U.S.C. 154(b) by 0 days.

(21) Appl. No.: 17/892,665

(22) Filed: Aug. 22, 2022

(65) Prior Publication Data
US 2022/0399436 A1  Dec. 15, 2022

Related U.S. Application Data

(62) Division of application No. 16/741,691, filed on Jan. 13, 2020, now abandoned.

(30) Foreign Application Priority Data

Aug. 1, 2019 (TW) .................................. 108127413

(51) Int. Cl.
| H01G 2/06 | (2006.01) |
| H05K 1/02 | (2006.01) |
| H01L 49/02 | (2006.01) |
| H01L 23/00 | (2006.01) |

(52) U.S. Cl.
CPC ............. *H01L 28/75* (2013.01); *H01G 2/065* (2013.01); *H01L 24/94* (2013.01); *H05K 1/0231* (2013.01); *H01L 2924/1205* (2013.01)

(58) Field of Classification Search
CPC . H01L 28/75; H01L 24/94; H01L 2924/1205; H01G 2/065; H05K 1/0231
See application file for complete search history.

(56) References Cited

U.S. PATENT DOCUMENTS

| 2009/0309187 A1* | 12/2009 | Choi ..................... H01L 28/40 257/532 |
| 2015/0348964 A1* | 12/2015 | Chou ..................... H01L 28/91 257/534 |
| 2021/0020737 A1* | 1/2021 | Lu ........................... H01L 28/75 |

FOREIGN PATENT DOCUMENTS

KR     20070040714 A  *  4/2007

\* cited by examiner

*Primary Examiner* — David M Sinclair
*Assistant Examiner* — Daniel M Dubuisson
(74) *Attorney, Agent, or Firm* — Chun-Ming Shih; LANWAY IPR SERVICES

(57) ABSTRACT

A capacitor is made using a wafer, and includes structural elevation portions to allow an electrode layer in the capacitor to be extended along surface profiles of the structural elevation portions to thereby increase its extension length, so as to reduce capacitor area, simplify capacitor manufacturing process and reduce manufacturing cost.

10 Claims, 12 Drawing Sheets

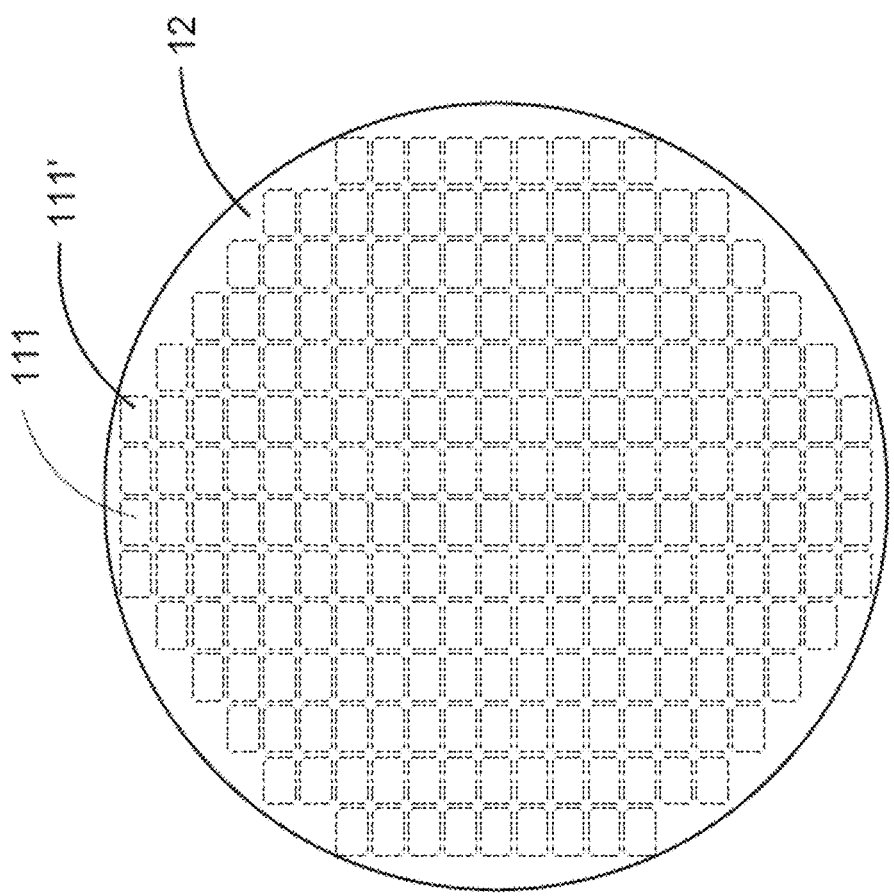
[Figure 1]

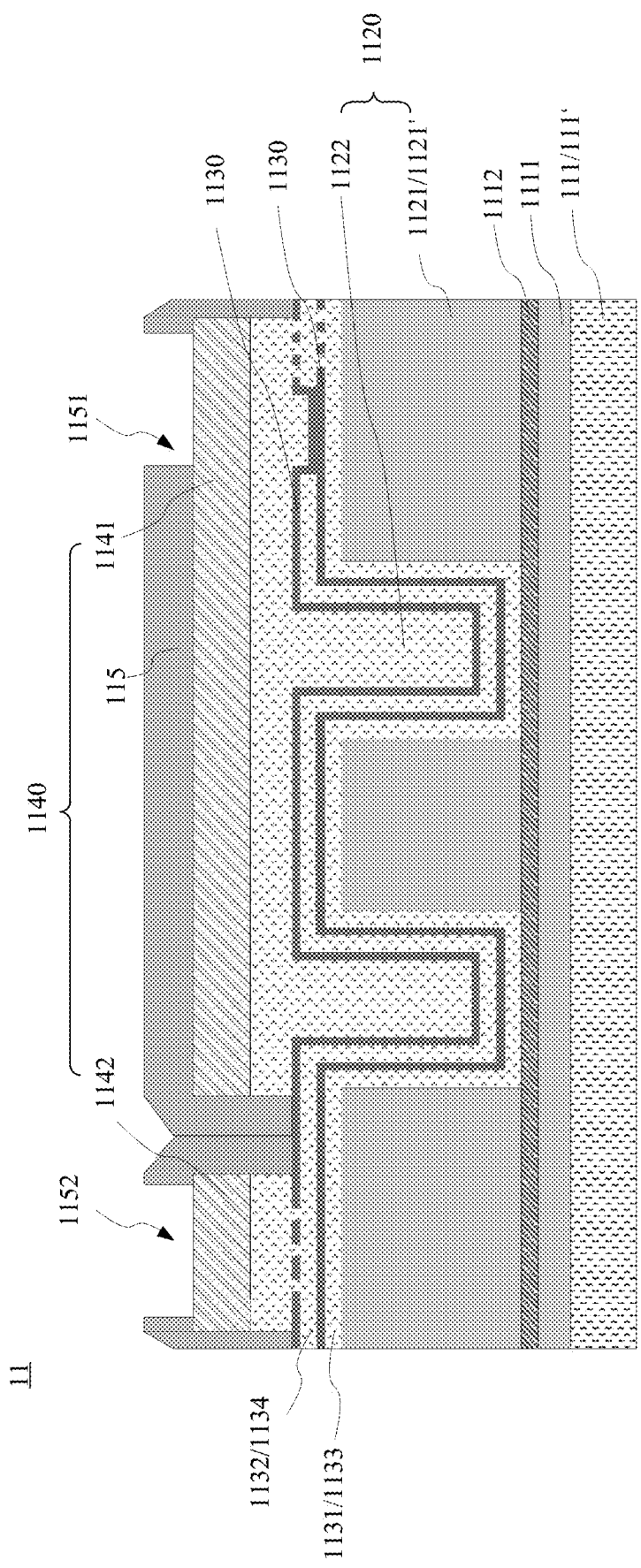
[Figure 2]

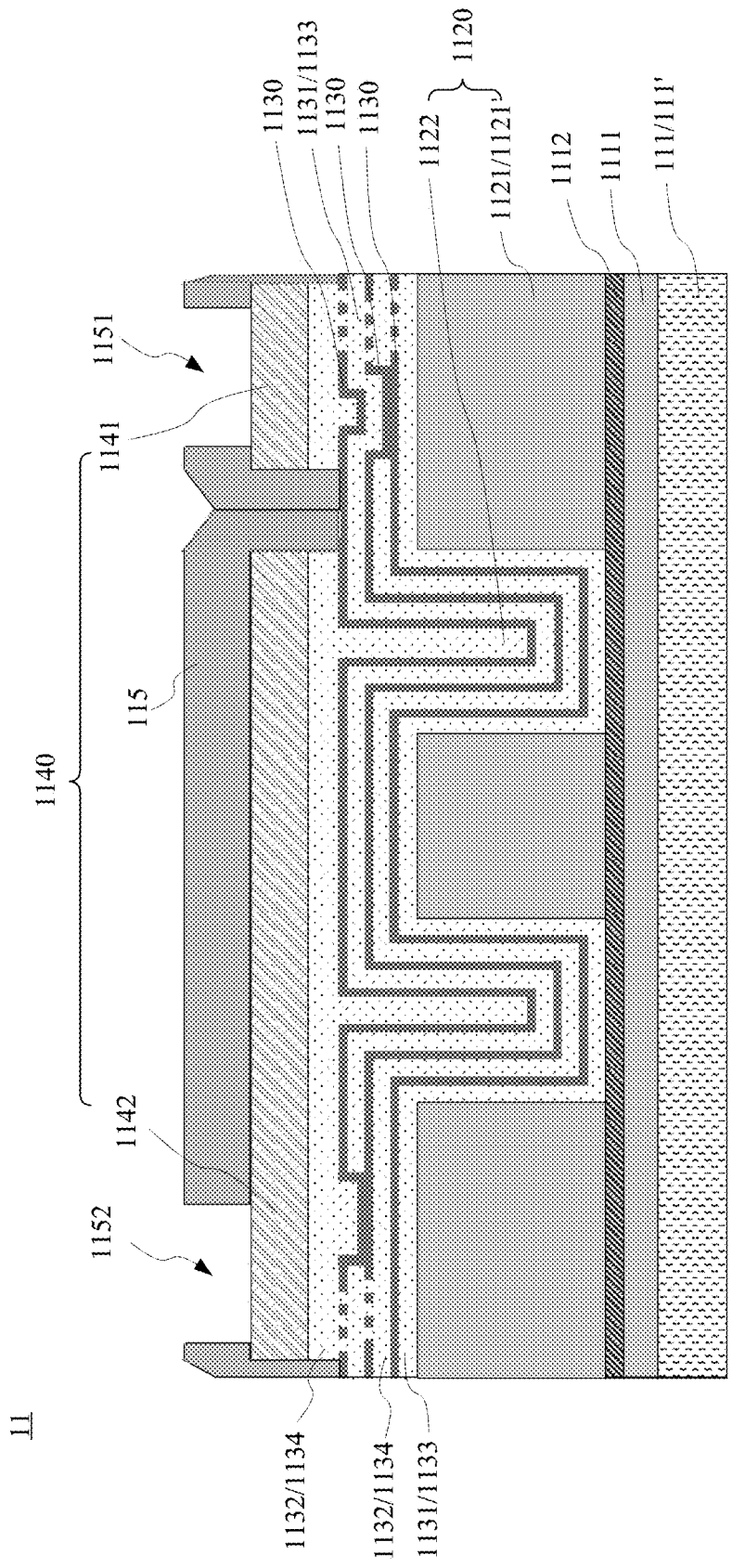
[Figure 3]

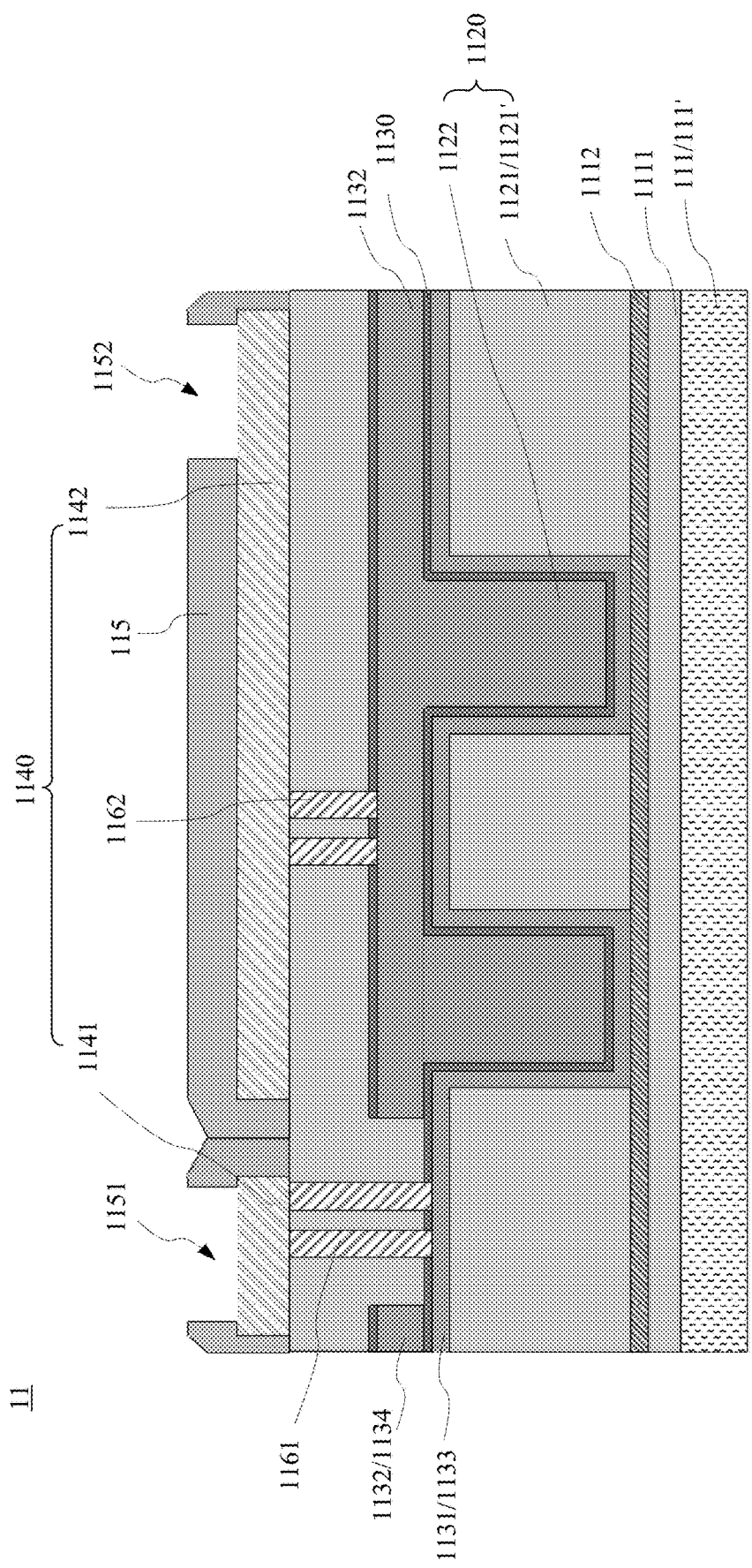
[Figure 4]

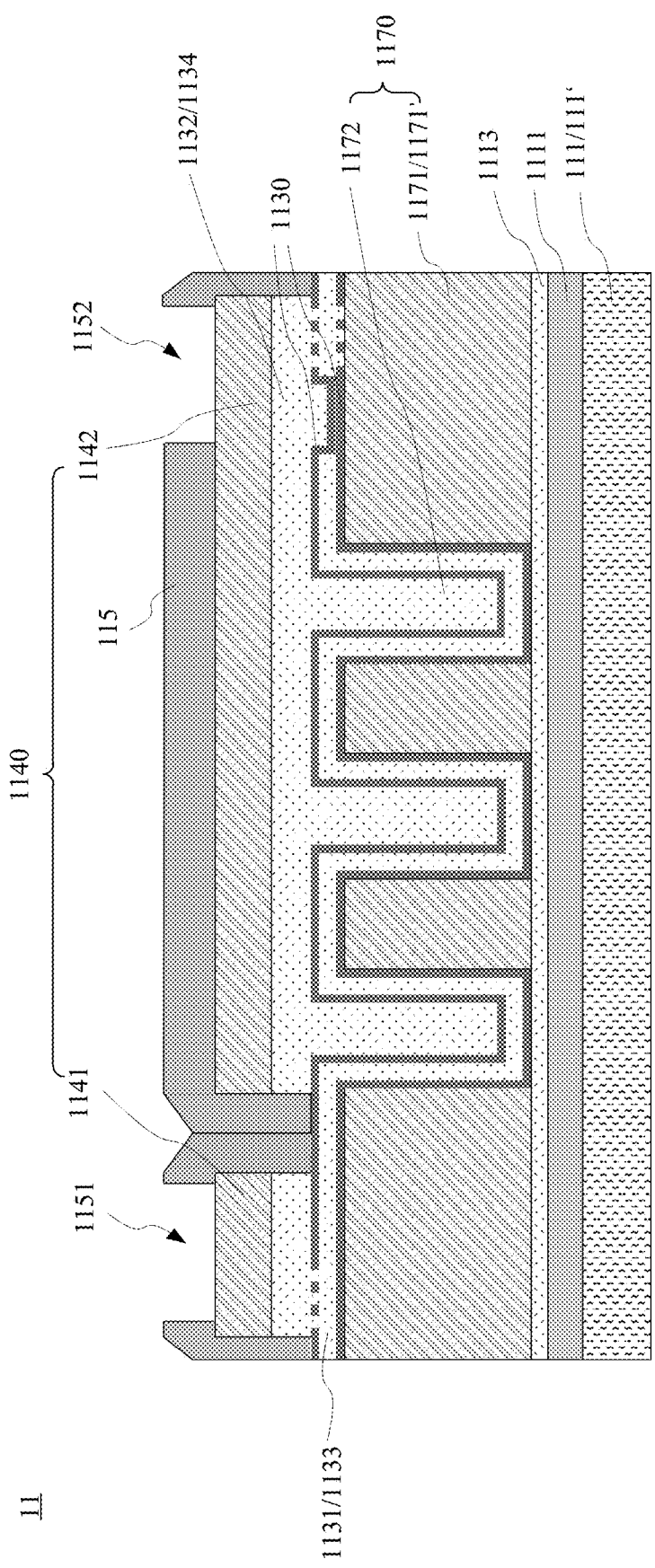
[Figure 5]

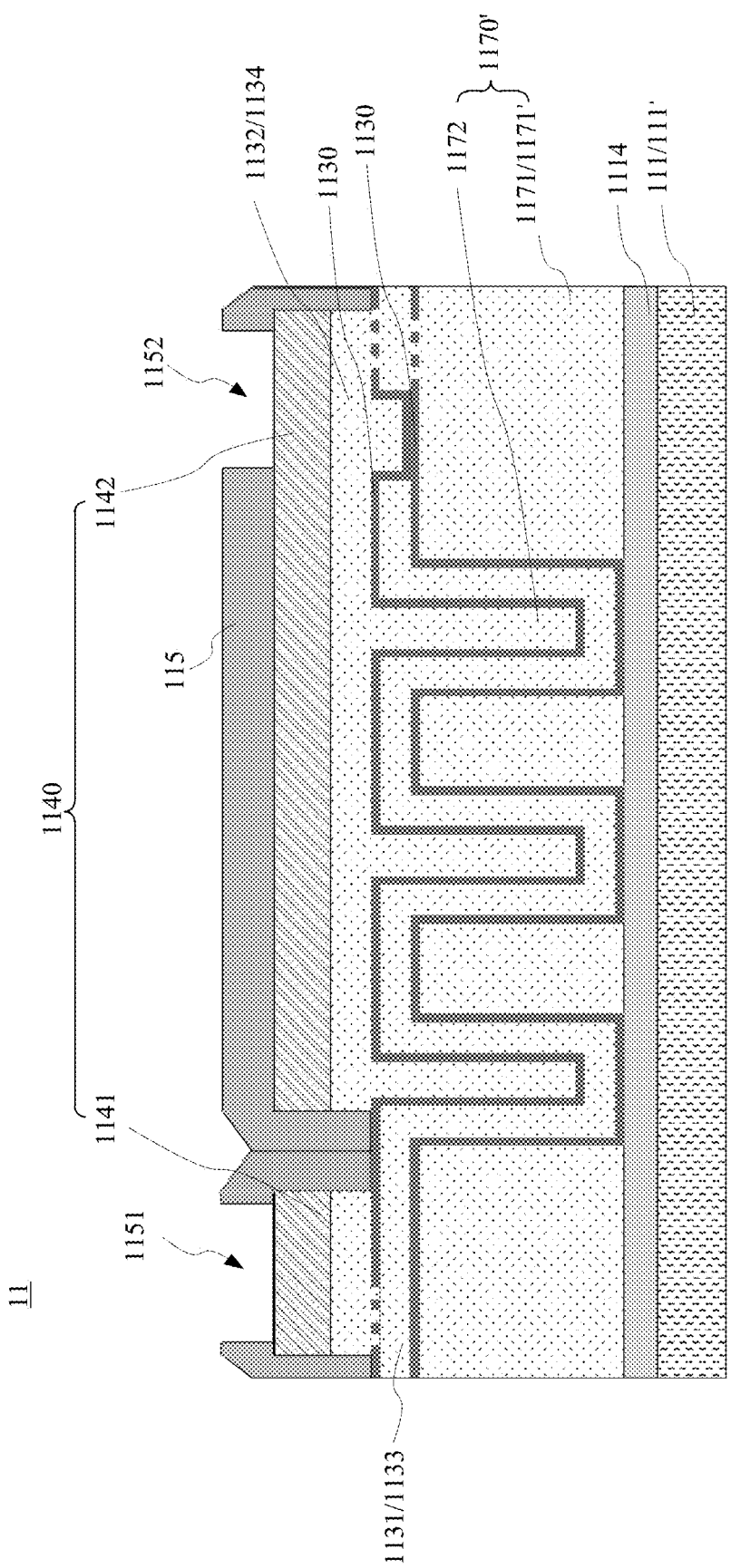
[Figure 6]

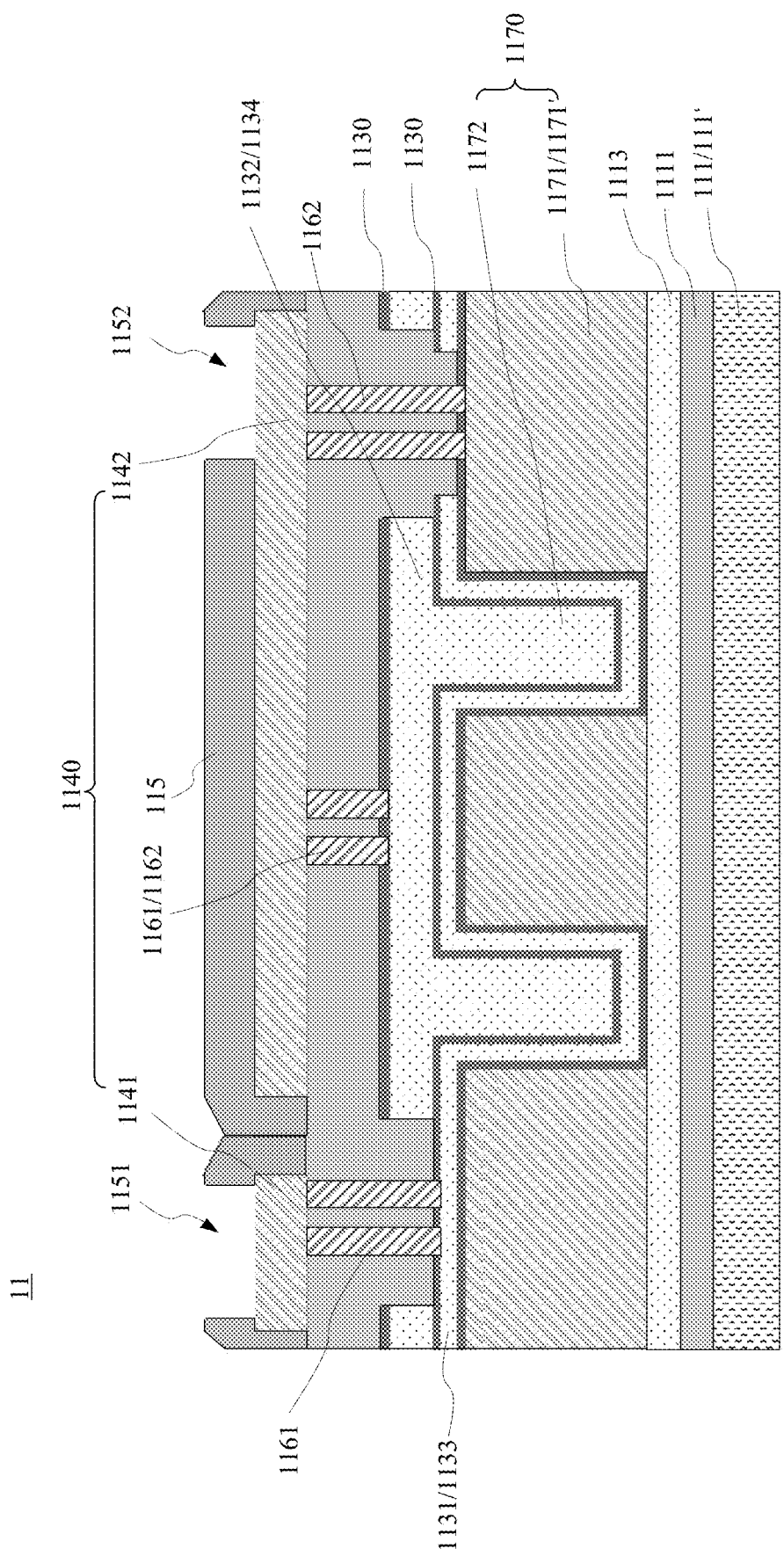
[Figure 7]

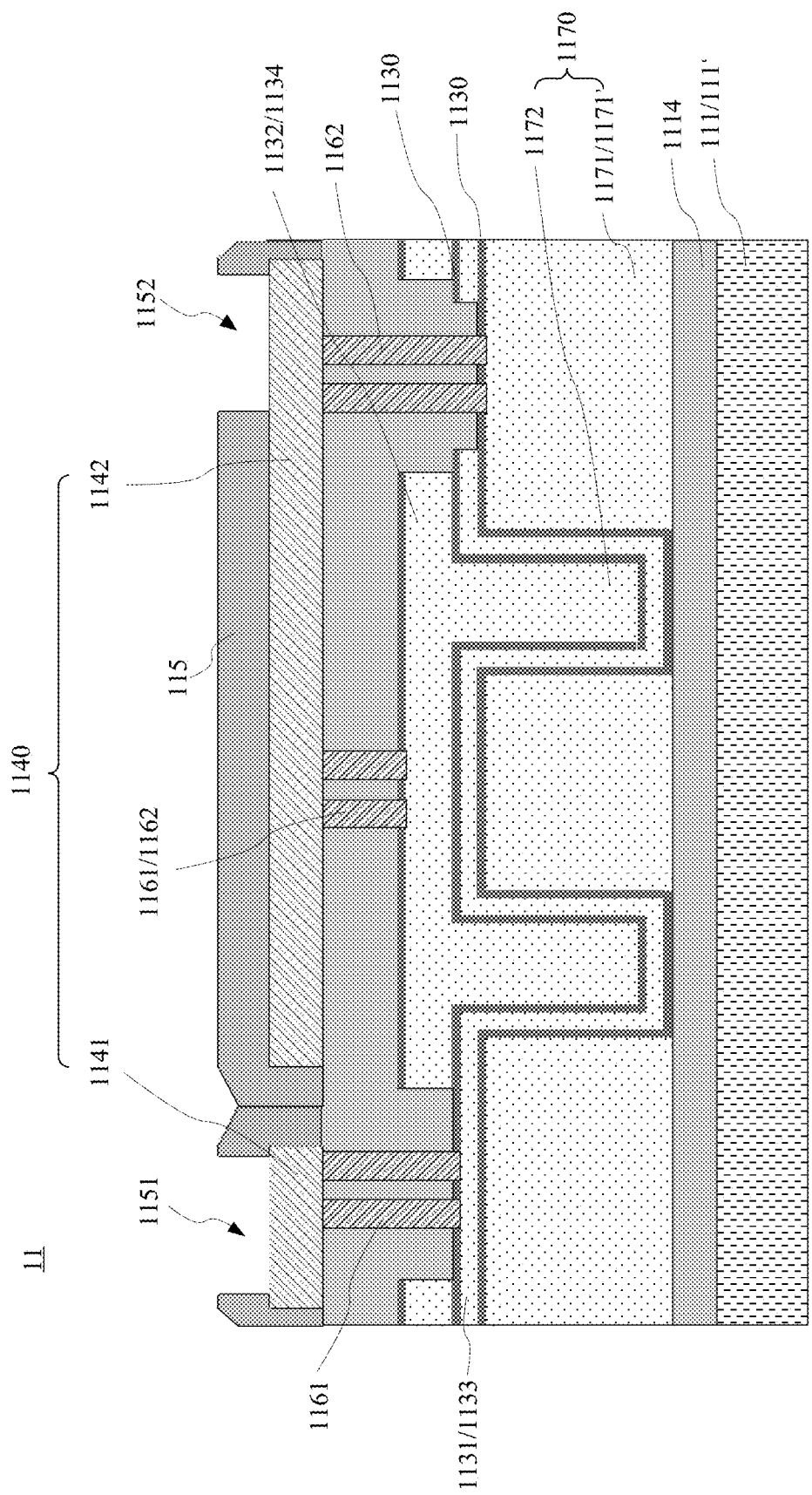
[Figure 8]

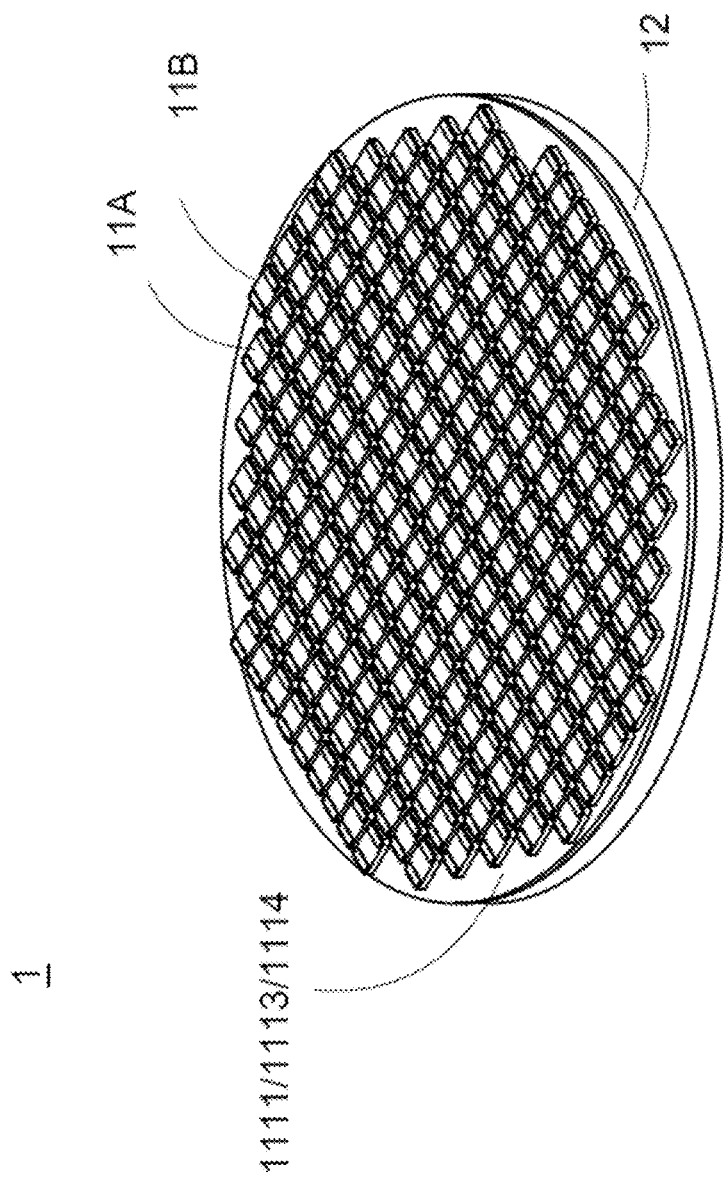
[Figure 9A]

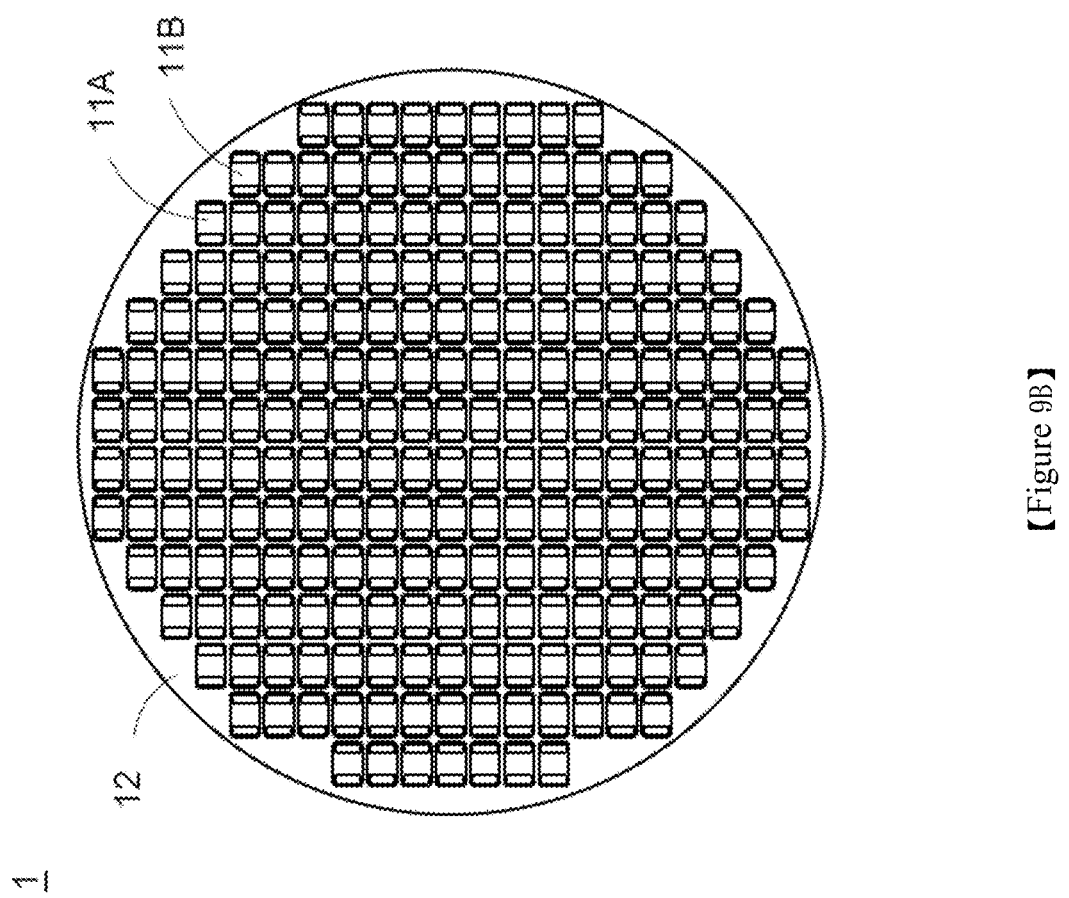
[Figure 9B]

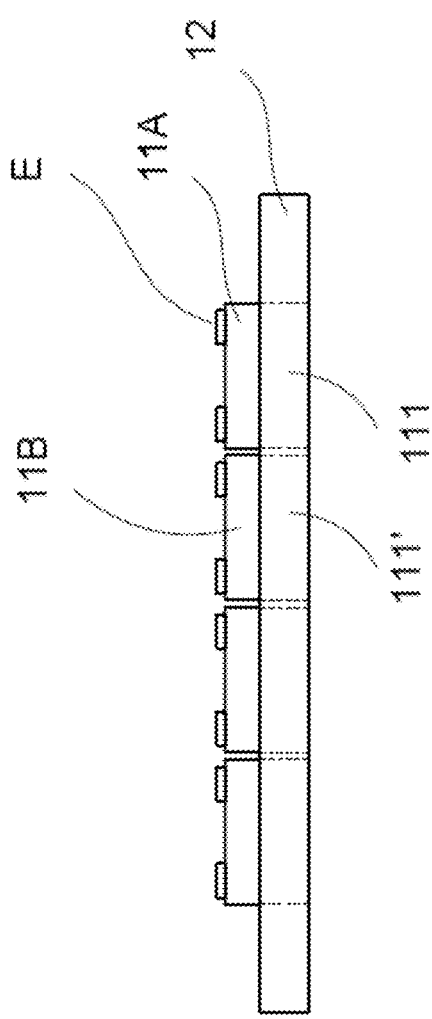
[Figure 9C]

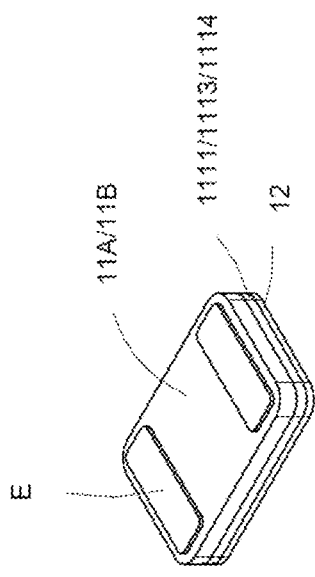
[Figure 10A]
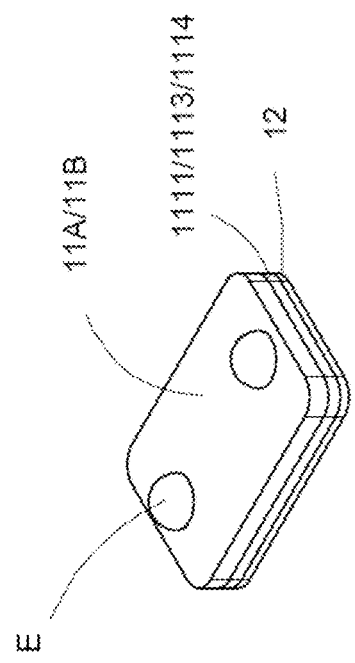
[Figure 10B]

CAPACITOR INTEGRATED STRUCTURE

CROSS-REFERENCE TO RELATED APPLICATIONS

This application is a divisional application of U.S. Ser. No. 16/741,691 filed on Jan. 13, 2020.

BACKGROUND OF THE INVENTION

Field of the Invention

The present invention relates to semiconductor technologies, and more particularly, to a semiconductor technology for massively producing capacitors from cutting.

Descriptions of the Related Art

Current complete capacitor (such as MLCC) manufacturing process includes powder milling, foil casting, printing, stacking, laminating, cutting, BBO (binder burn out), sintering, dipping, curing, electroplating, testing, and taping, etc. This process is quite mature, though complicated, giving the capacitors in sufficient supply and stable production for long time. Recently with technological innovations such as Internet, 5G communications, artificial intelligence, electric cars and so on, and with functional improvements of various electronic products, there are more and more demands in types and numbers of components being adopted. Active components are required with increased quantities and higher precision, thus greatly raising the number of passive components that are to be used with the active components, especially MLCC (multi-layer ceramic chip) capacitors. This thereby results in short supply of the passive components, while manufacturers thereof have not yet found a solution to massive production to meet the market demands for passive components. Moreover, another issue is about fitting all required components in a limited space in order to have a high density layout of components, which must be achieved by using compact components with reduced area and/or volume. This is however quite challenging to conventional capacitor manufacturing technique in terms of size reduction or product precision improvement.

In view of this, compared to conventional MLCC production, the present invention uses different material, structure and manufacturing process so as to provide another option of capacitor for the market. The present invention also makes it easier to achieve area reduction of capacitors and thus improves product precision. The present invention further avoids a high temperature calcination procedure of the conventional MLCC manufacturing process, thereby in favor of energy saving, carbon reduction and cost decrease.

SUMMARY OF THE INVENTION

In view of the above drawbacks in the prior art, a primary object of the present invention is to provide a capacitor, which is more easily made with reduced area, and simplify its manufacturing process and reduce its cost.

Another primary object of the present invention is to provide a capacitor, which is manufactured by using current semiconductor equipment, to thereby simplify its manufacturing process and reduce its cost, and desirably provide another option of capacitor for the market.

For the objects said above and for other objects, the first embodiment of the present invention provides a capacitor made by a wafer and for being bonded to a printed circuit board, the capacitor including: a first base layer; at least one first insulating elevation portion located above the first base layer; at least one first electrode layer located above the first insulating elevation portion and having first polarity, wherein the first electrode layer is extended along surface profiles of the first insulating elevation portion to increase its extension length; at least one second electrode layer located above the first electrode layer and having second polarity, wherein the second electrode layer is extended along surface profiles of the first electrode layer to increase its extension length; a first electrode pad electrically connected to the first electrode layer; and a second electrode pad electrically connected to the second electrode layer, wherein the first electrode pad and the second electrode pad are respectively for being bonded to the printed circuit board; and the first base layer is provided on the wafer.

Preferably, in the above capacitor, wherein the at least one first electrode layer includes a plurality of first electrode layers, and the at least one second electrode layer includes a plurality of second electrode layers, wherein the first electrode layers and the second electrode layers are stacked in a staggered manner.

Preferably, in the above capacitor, wherein the at least one first insulating elevation portion includes a plurality of first insulating elevation portions, and there is an insulating elevation recess situated between adjacent two of the first insulating elevation portions, wherein the first electrode layer is extended further along surface profiles of the insulating elevation recess to increase its extension length.

Preferably, in the above capacitor, further including: a protection layer including a first exposed portion and a second exposed portion, wherein the first electrode pad is at least partly exposed from the first exposed portion, and the second electrode pad is at least partly exposed from the second exposed portion.

Preferably, in the above capacitor, further including: at least one dielectric layer located between the first electrode layer and the second electrode layer, for providing electrical isolation between the first electrode layer and the second electrode layer.

Preferably, in the above capacitor, further including: a first conductive channel extended from the first electrode pad to the first electrode layer, for electrically connecting the first electrode pad to the first electrode layer; and a second conductive channel extended from the second electrode pad to the second electrode layer, for electrically connecting the second electrode pad to the second electrode layer.

The present invention provides a capacitor integrated structure made using a wafer. The capacitor integrated structure includes a first capacitor and a second capacitor. The first capacitor includes a first base layer, first insulating elevation portions, a first electrode layer and a second electrode layer. The first insulating elevation portions are located above the first base layer. The first electrode layer is located above the first insulating elevation portions and has first polarity, and is extended along surface profiles of the first insulating elevation portions to increase its extension length. The second electrode layer is located above the first electrode layer and has second polarity, and is extended along surface profiles of the first electrode layer to increase its extension length. The second capacitor includes a second base layer, second insulating elevation portions, a third electrode layer and a fourth electrode layer. The second insulating elevation portions are located above the second base layer. The third electrode layer is located above the second insulating elevation portions and has first polarity, and is extended along surface profiles of the second insulating elevation portions to increase its extension length. The fourth electrode layer is located above the third electrode layer and has second polarity, and is extended along surface profiles of the third electrode layer to increase its extension length. The first capacitor and the second capacitor are substantially identical in structure. The first base layer and the second base layer are respectively provided on the wafer.

Furthermore, the present invention further provides a capacitor, a capacitor made by a wafer and for being bonded to a printed circuit board, the capacitor including: a first base layer; at least one first conductive elevation portion located above the first base layer and having second polarity; at least one first electrode layer located above the first conductive elevation portion and having first polarity, wherein the first electrode layer is extended along surface profiles of the first conductive elevation portion to increase its extension length; a first electrode pad electrically connected to the first electrode layer and having the first polarity; and a second electrode pad electrically connected to the first conductive elevation portion and having the second polarity, wherein the first electrode pad and the second electrode pad are respectively for being bonded to the printed circuit board.

Preferably, in the above capacitor, further including at least one second electrode layer located above the first electrode layer and electrically connected to the first conductive elevation portion to have the second polarity, wherein the second electrode layer is extended along surface profiles of the first electrode layer to increase its extension length.

Preferably, in the above capacitor, wherein the at least one first electrode layer includes a plurality of first electrode layers, and the at least one second electrode layer includes a plurality of second electrode layers, wherein the first electrode layers and the second electrode layers are stacked in a staggered manner.

Preferably, in the above capacitor, wherein the at least one first conductive elevation portion includes a plurality of first conductive elevation portions, and there is an conductive elevation recess situated between adjacent two of the first conductive elevation portions, wherein the first electrode layer is extended further along surface profiles of the conductive elevation recess to increase its extension length.

Preferably, in the above capacitor, further including: a protection layer including a first exposed portion and a second exposed portion, wherein the first electrode pad is at least partly exposed from the first exposed portion, and the second electrode pad is at least partly exposed from the second exposed portion.

Preferably, in the above capacitor, further including: at least one dielectric layer located between the first electrode layer and the first conductive elevation portion, for providing electrical isolation between the first electrode layer and the first conductive elevation portion.

Preferably, in the above capacitor, further including: a first conductive channel extended from the first electrode pad to the first electrode layer, for electrically connecting the first electrode pad to the first electrode layer; and a second conductive channel extended from the second electrode pad to the first conductive elevation portion, for electrically connecting the second electrode pad to the first conductive elevation portion.

Preferably, in the above capacitor, wherein the first base layer is silicon substrate, glass substrate or quartz substrate.

Preferably, in the above capacitor, wherein the capacitor further including an etching stop layer located above the first base layer.

Moreover, the present invention also provides a capacitor integrated structure including a first capacitor and a second capacitor. The first capacitor includes a first base layer, first conductive elevation portions and a first electrode layer. The first conductive elevation portions are located above the first base layer and have second polarity. The first electrode layer is located above the first conductive elevation portions and has first polarity, and is extended along surface profiles of the first conductive elevation portions to increase its extension length. The second capacitor includes a second base layer, second conductive elevation portions and a third electrode layer. The second conductive elevation portions are located above the second base layer and have second polarity. The third electrode layer is located above the second conductive elevation portions and has first polarity, and is extended along surface profiles of the second conductive elevation portions to increase its extension length. The first capacitor and the second capacitor are substantially identical in structure.

The present invention further provides a capacitor manufacturing method by which the above capacitor integrated structure is cut to separate the first capacitor and the second capacitor from each other.

Therefore, the present invention allows a capacitor integrated structure composed of a plurality of capacitors to be formed on a wafer, and cuts the capacitor integrated structure to separate the plurality of capacitors from each other so as to massively produce capacitors. Compared to the conventional MLCC manufacturing process, the present invention simplifies the capacitor manufacturing process while avoids a high temperature calcination procedure of the conventional MLCC manufacturing process. The present invention also allows the capacitor integrated structure to be manufactured by current semiconductor equipment, thereby in favor of cost reduction.

Moreover, the capacitor in the present invention includes structural elevation portions, which increase an extension length of its electrode layer and thus reduce capacitor area. Preferably, the structural elevation portions can be made of a metallic material, and with the metallic structural elevation portions serving as electrodes, the number of electrode layers is reduced in the capacitor, thereby simplifying the capacitor structure and lowering its manufacturing cost.

BRIEF DESCRIPTION OF THE DRAWINGS

The above and other aspects, features and other advantages of the present invention will be more clearly understood from the following detailed description taken in conjunction with the accompanying drawings, in which:

FIG. 1 is a schematic diagram of a wafer used for manufacturing capacitors according to an embodiment of the present invention;

FIGS. 2 to 4 are structural schematic diagrams of a capacitor according to a first embodiment of the present invention;

FIGS. 5 to 8 are structural schematic diagrams of a capacitor according to a second embodiment of the present invention;

FIGS. 9A to 9C are schematic diagrams of a capacitor integrated structure according to the present invention; and FIGS. 10A to 10B are schematic diagrams of capacitors according to the present invention.

DETAILED DESCRIPTION OF THE PREFERRED EMBODIMENT

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

In the following, elements with the same or similar functions will be described using the same reference numerals, and the description of the same or equivalent features will be omitted for the disclosed content to be more concise and easier to be understood.

Referring to FIG. 1, the present invention provides capacitors made using a wafer 12. FIGS. 2 to 4 show a capacitor 11 according to a first embodiment of the present invention. As shown, the capacitor 11 includes a first base layer 111, first insulating elevation portions 1121, a first electrode layer 1131, a second electrode layer 1132, a first electrode pad 1141 and a second electrode pad 1142.

The first base layer 111 is mounted on the wafer 12 shown in FIG. 1. In this embodiment, an isolation layer 1111 is further formed on the first base layer 111 by depositing a base insulation layer on the first base layer 111 by means of, for example, chemical vapor deposition (CVD) or oxidation deposition. The first base layer 111 is, for example but not limited to, a silicon substrate used for producing integrated circuits, and can also be made of another material, such as glass substrate, quartz substrate and so on.

The first insulating elevation portions 1121 are located above the first base layer 111, and are formed by denting an insulation layer 1120. Particularly, the insulation layer 1120 is provided above the isolation layer 1111 on the first base layer 111, and is subjected to a denting procedure to obtain the first insulating elevation portions 1121. In the embodiment shown in FIG. 2, the insulation layer 1120 is dented to have two recesses and thus form three of the first insulating elevation portions 1121, wherein there is an insulating elevation recess 1122 situated between any adjacent two of the first insulating elevation portions 1121 in a manner that, the first insulating elevation portions 1121 and the insulating elevation recesses 1122 are arranged in a staggered layout on the first base layer 111. Preferably, there can further be provided an etching stop layer 1112 between the isolation layer 1111 and the insulation layer 1120.

The first electrode layer 1131 is located above the first insulating elevation portions 1121 and has a first polarity. It is applied and extended along surface profiles of the insulating elevation portions 1121 and insulating elevation recesses 1122, making the first electrode layer 1131 entirely have a serpentine pattern with curved and twisted traces. This increases an extension length of the first electrode layer 1131 and thus enlarges capacity of the capacitor 11. The second electrode layer 1132 is located above the first electrode layer 1131 and has a second polarity. It is applied and extended along surface profiles of the first electrode layer 1131, making the second electrode layer 1132 similarly have serpentine traces, thereby increasing an extension length of the second electrode layer 1132 and also enlarging capacity of the capacitor 11.

As shown in FIG. 3, the capacitor 11 may include a plurality of first electrode layers 1131 and a plurality of second electrode layers 1132, wherein the first electrode layers 1131 and the second electrode layers 1132 are stacked in a staggered manner, and a dielectric layer 1130 can further be formed between any adjacent the first electrode layer 1131 and the second electrode layer 1132 to provide electrical isolation for them.

The first electrode pad 1141 and the second electrode pad 1142 are electrically connected to the first electrode layer 1131 and the second electrode layer 1132 respectively, such that the first electrode pad 1141 has first polarity, and the second electrode pad 1142 has second polarity. Preferably, a metal layer 1140 is provided on the topmost first electrode layer 1131 or second electrode layer 1132, and is etched to have recesses. Then, a protection layer 115 is applied over the metal layer 1140 and fills the recesses of the metal layer 1140 to form electrically isolated first electrode pad 1141 and second electrode pad 1142. The protection layer 115 is then etched to form a first exposed portion 1151 and a second exposed portion 1152, wherein the first electrode pad 1141 is at least partly exposed from the first exposed portion 1151, and the second electrode pad 1142 is at least partly exposed from the second exposed portion 1152, such that the first electrode pad 1141 and the second electrode pad 1142 can be respectively bonded to a printed circuit board (PCB).

In another embodiment of the invention, the capacitor 11 further includes a first conductive channel 1161 and a second conductive channel 1162, as shown in FIG. 4. The first conductive channel 1161 is extended from the first electrode pad 1141 to the first electrode layer 1131, and is used to electrically connect the first electrode pad 1141 to the first electrode layer 1131. The second conductive channel 1162 is extended from the second electrode pad 1142 to the second electrode layer 1132, and is used to electrically connect the second electrode pad 1142 to the second electrode layer 1132.

FIGS. 5 to 8 show a capacitor 11 according to a second embodiment of the present invention. This capacitor 11 is also made using the wafer 12 (shown in FIG. 1). It includes a first base layer 111, first conductive elevation portions 1171, a first electrode layer 1131, a first electrode pad 1141 and a second electrode pad 1142.

The first base layer 111 is mounted on the wafer 12. In this embodiment, an isolation layer 1111 is further formed on the first base layer 111 by depositing a base insulation layer on the first base layer 111 by means of, for example, chemical vapor deposition (CVD) or oxidation deposition. The first base layer 111 is, for example but not limited to, a silicon substrate used for producing integrated circuits, and can also be made of another material, such as glass substrate, quartz substrate and so on.

The first conductive elevation portions 1171 are located above the first base layer 111 and have second polarity. In this embodiment, the first conductive elevation portions 1171 are formed by denting a metallic material layer 1170. Particularly, the metallic material layer 1170 is provided above an isolation layer 1111 on the first base layer 111, and is subjected to a denting procedure to obtain the first conductive elevation portions 1171. In the embodiment shown in FIG. 5, there are three recesses formed in the metallic material layer 1170 to obtain four of the first conductive elevation portions 1171, and there is a conductive elevation recess 1172 situated between any adjacent two of the first conductive elevation portions 1171 in a manner that, the first conductive elevation portions 1171 and the conductive elevation recesses 1172 are arranged in a staggered layout on the first base layer 111. Preferably, there can further be provided a conductive layer 1113 serving as an etching stop layer between the isolation layer 1111 and the metallic material layer 1170.

Referring to FIG. 6, preferably, the metallic material layer 1170 can be replaced with a polycrystalline material layer 1170', and there can further be formed an implant layer 1114 serving as an etching stop layer between the polycrystalline material layer 1170' and the first base layer 111.

The first electrode layer 1131 is located above the first conductive elevation portions 1171 and has first polarity. It is applied and extended along surface profiles of the first conductive elevation portions 1171 and the conductive elevation recesses 1172, making the first electrode layer 1131 entirely have serpentine traces and increase its extension length to thereby enlarge capacity of the capacitor 11.

As shown in FIGS. 7 and 8, the capacitor 11 further includes a second electrode layer 1132 located above the first electrode layer 1131. The second electrode layer 1132 is electrically connected to the first conductive elevation portions 1171 and thus has the same second polarity as the first conductive elevation portions 1171. The second electrode layer 1132 is applied and extended along surface profiles of the first electrode layer 1131 to similarly have serpentine traces, making the second electrode layer 1132 increase its extension length and thereby enlarging capacity of the capacitor 11.

In other embodiment, the capacitor 11 may include a plurality of first electrode layers 1131 and a plurality of second electrode layers 1132, wherein the first electrode layers 1131 and the second electrode layers 1132 are stacked in a staggered manner, and a dielectric layer 1130 can further be formed between any adjacent first electrode layer 1131 and the second electrode layer 1132 to provide electrical isolation for them.

The first electrode pad 1141 and the second electrode pad 1142 are electrically connected to the first electrode layer 1131 and the first conductive elevation portions 1171, respectively, such that the first electrode pad 1141 has first polarity, and the second electrode pad 1142 has second polarity. Preferably, a metal layer 1140 is provided on the topmost the first electrode layer 1131 or the second electrode layer 1132, and is etched to have recesses. Then, a protection layer 115 is applied over the metal layer 1140 and fills the recesses of the metal layer 1140 to form electrically isolated the first electrode pad 1141 and the second electrode pad 1142. The protection layer 115 is then etched to form first exposed portion 1151 and the second exposed portion 1152, wherein the first electrode pad 1141 is at least partly exposed from the first exposed portion 1151, and the second electrode pad 1142 is at least partly exposed from the second exposed portion 1152, such that the first electrode pad 1141 and the second electrode pad 1142 can be respectively bonded to a printed circuit board (PCB).

In another embodiment of the invention, the capacitor 11 further includes a first conductive channel 1161 and a second conductive channel 1162, as shown in FIG. 7 or FIG. 8. The first conductive channel 1161 is extended from the first electrode pad 1141 to the first electrode layer 1131, and is used to electrically connect the first electrode pad 1141 to the first electrode layer 1131. The second conductive channel 1162 is extended from the first electrode pad 1141 to the first conductive elevation portions 1171, and is used to electrically connect the first conductive elevation portions 1171 to the second electrode pad 1142.

Moreover, the present invention further provides a capacitor integrated structure 1 for the capacitors 11 in the first embodiment and the second embodiment, as shown in FIGS. 9A to 9C.

The capacitor integrated structure 1 in the present invention mainly uses the wafer 12 to form the capacitor 11 according to the above first embodiment. The capacitor integrated structure 1 can form at least one first capacitor 11A and at least one second capacitor 11B through a cutting procedure, which are substantially identical in structure.

The first capacitor 11A includes a first base layer 111, first insulating elevation portions 1121, a first electrode layer 1131 and a second electrode layer 1132. The first insulating elevation portions 1121 are located above the first base layer 111. The first electrode layer 1131 is located above the first insulating elevation portions 1121 and has first polarity, and is extended along surface profiles of the first insulating elevation portions 1121 to have serpentine traces to thereby increase its extension length. The second electrode layer 1132 is located above the first electrode layer 1131 and has second polarity, and is extended along surface profiles of the first electrode layer 1131 to similarly have serpentine traces to thereby effectively increase its extension length.

The second capacitor 11B includes a second base layer 111', second insulating elevation portions 1121', a third electrode layer 1133 and a fourth electrode layer 1134. The second insulating elevation portions 1121' are located above the second base layer 111'. The third electrode layer 1133 is located above the second insulating elevation portions 1121' and has first polarity, and is extended along surface profiles of the second insulating elevation portions 1121' to have serpentine traces to thereby increase its extension length. The fourth electrode layer 1134 is located above the third electrode layer 1133 and has second polarity, and is extended along surface profiles of the third electrode layer 1133 to similarly have serpentine traces to thereby increase its extension length.

Moreover, structural details and manufacturing procedures for the first capacitor 11A and the second capacitor 11B are basically same as the capacitor 11 shown in FIGS. 2 to 4, and are thus not to be further described here.

The capacitor integrated structure 1 in the present invention mainly uses the wafer 12 to form the capacitor 11 according to the above second embodiment. The capacitor integrated structure 1 can form a first capacitor 11A and a second capacitor 11B through a cutting procedure, which are substantially identical in structure.

The first capacitor 11A includes a first base layer 111, at least one first conductive elevation portions 1171 and at least one first electrode layer 1131. The first conductive elevation portions 1171 are located above the first base layer 111 and has second polarity. The first electrode layer 1131 is located above the first conductive elevation portions 1171 and has first polarity, and is extended along surface profiles of the first conductive elevation portions 1171 to have serpentine traces to thereby increase its extension length.

The second capacitor 11B includes a second base layer 111', at least one second conductive elevation portions 1171' and at least one third electrode layer 1133. The second conductive elevation portions 1171' are located above the second base layer 111' and has second polarity. The third electrode layer 1133 is located above the second conductive elevation portions 1171' and has first polarity, and is extended along surface profiles of the second conductive elevation portions 1171' to have serpentine traces to thereby increase its extension length.

Moreover, structural details and manufacturing procedures for the first capacitor 11A and the second capacitor 11B are basically same as the capacitor 11 shown in FIGS. 5 to 8, and are thus not to be further described here.

In this invention, as shown in FIG. 1, the first base layer 111 and the second base layer 111' are respectively mounted on the wafer 12, making the first capacitor 11A and the second capacitor 11B arranged in an array on the wafer 12 to form the capacitor integrated structure 1, as shown in FIGS. 9A to 9B. The capacitor integrated structure 1 can thus be cut to separate the first capacitor 11A and the second capacitor 11B from each other and obtain individual the first capacitor 11A and the second capacitor 11B shown in FIGS. 10A and 10B. This allows capacitors to be manufactured by current semiconductor equipment used for substrates, such that the capacitor manufacturing process is simplified and the capacitors can be massively produced. Preferably, electrode contacts E of the first capacitor 11A and the second capacitors 11B are flexibly shaped as rectangular prism or hemisphere, as shown in FIGS. 10A and 10B.

Therefore, the present invention allows a plurality of capacitors to be formed on a wafer to construct a capacitor integrated structure composed of the plurality of capacitors. The capacitor integrated structure can be cut to separate the capacitors from each other so as to produce massive individual capacitors at a time, thereby simplifying the current capacitor manufacturing process while avoiding a high temperature calcination procedure of the conventional MLCC manufacturing process. The present invention also allows the capacitor integrated structure to be manufactured by current semiconductor manufacturing equipment, thereby in favor of cost reduction.

Moreover, the capacitor in the present invention includes structural elevation portions, making its electrode layer extended along surface profiles of the structural elevation portions to have serpentine traces. This desirably increases an extension length of the electrode layer, reduces capacitor area and enlarges capacitor capacity, thereby in favor of size miniaturization of electronic products. Further, the present invention can also use a metallic material to form the structural elevation portions, and with the metallic structural elevation portions serving as conductive electrodes, the number of electrode layers is reduced in the capacitor, thereby simplifying the capacitor structure and lowering its manufacturing cost.

The examples above are only illustrative to explain principles and effects of the invention, but not to limit the invention. It will be apparent to those skilled in the art that modifications and variations can be made without departing from the scope of the invention. Therefore, the protection range of the rights of the invention should be as defined by the appended claims.

What is claimed is:

1. A capacitor made by a wafer and for being bonded to a printed circuit board, the capacitor including:
    a base layer;
    at least one conductive elevation portion located above the base layer and having a second polarity;
    an etching stop layer located between the base layer and the conductive elevation portion;
    at least one first electrode layer located above the conductive elevation portion and having a first polarity, wherein the first electrode layer is extended along surface profiles of the conductive elevation portion to increase an extension length of the first electrode layer;
    a first electrode pad electrically connected to the first electrode layer and having the first polarity; and
    a second electrode pad electrically connected to the conductive elevation portion and having the second polarity, wherein
    the first electrode pad and the second electrode pad are respectively for being bonded to the printed circuit board; and
    the base layer is provided on the wafer.

2. The capacitor according to claim 1, further including: at least one second electrode layer located above the first electrode layer and electrically connected to the conductive elevation portion to have the second polarity, wherein the second electrode layer is extended along surface profiles of the first electrode layer to increase an extension length of the second electrode layer.

3. The capacitor according to claim 2, wherein the at least one first electrode layer includes a plurality of first electrode layers, and the at least one second electrode layer includes a plurality of second electrode layers, wherein the first electrode layers and the second electrode layers are stacked in a staggered manner.

4. The capacitor according to claim 1, wherein there are a plurality of conductive elevation portions, and there is a conductive elevation recess situated between adjacent two of the first conductive elevation portions, wherein the first electrode layer is extended further along surface profiles of the conductive elevation recess to increase the extension length of the first electrode layer.

5. The capacitor according to claim 1, further including:
    a protection layer including a first exposed portion and a second exposed portion, wherein the first electrode pad is at least partly exposed from the first exposed portion, and the second electrode pad is at least partly exposed from the second exposed portion.

6. The capacitor according to claim 1, further including:
    at least one dielectric layer located between the first electrode layer and the conductive elevation portion, for providing electrical isolation between the first electrode layer and the conductive elevation portion.

7. The capacitor according to claim 6, further including:
    a first conductive channel extended from the first electrode pad to the first electrode layer, for electrically connecting the first electrode pad to the first electrode layer; and
    a second conductive channel extended from the second electrode pad to the conductive elevation portion, for electrically connecting the second electrode pad to the conductive elevation portion.

8. The capacitor according to claim 1, wherein the base layer is silicon substrate, glass substrate or quartz substrate.

9. The capacitor according to claim 1, wherein the etching stop layer is an implant layer directly disposed on the base layer.

10. The capacitor according to claim 1, further comprising an isolation layer sandwiched between the etching stop layer and the base layer.

* * * * *